(12) United States Patent
Sorensen et al.

(10) Patent No.: US 7,126,826 B1
(45) Date of Patent: Oct. 24, 2006

(54) QUICK-CONNECT THERMAL SOLUTION FOR COMPUTER HARDWARE TESTING

(75) Inventors: George A. Sorensen, Fremont, CA (US); Bruce R. Michaud, Clayton, CA (US)

(73) Assignee: NVIDIA Corporation, Santa Clara, CA (US)

( * ) Notice: Subject to any disclaimer, the term of this patent is extended or adjusted under 35 U.S.C. 154(b) by 184 days.

(21) Appl. No.: 10/960,350

(22) Filed: Oct. 6, 2004

(51) Int. Cl.
*H05K 7/20* (2006.01)

(52) U.S. Cl. .................... 361/719; 361/704; 361/707; 257/718; 257/719; 165/80.3

(58) Field of Classification Search ................. None
See application file for complete search history.

(56) References Cited

U.S. PATENT DOCUMENTS

| | | | | |
|---|---|---|---|---|
| 5,808,236 A * | 9/1998 | Brezina et al. ............ | 174/16.3 |
| 6,313,995 B1 * | 11/2001 | Koide et al. ................ | 361/705 |
| 6,356,448 B1 * | 3/2002 | DiBene et al. .............. | 361/721 |
| 6,459,582 B1 * | 10/2002 | Ali et al. .................... | 361/704 |
| 6,501,018 B1 * | 12/2002 | Mayer ........................ | 174/370 |
| 6,504,722 B1 * | 1/2003 | Vittet et al. ................. | 361/704 |
| 6,545,879 B1 * | 4/2003 | Goodwin .................... | 361/807 |
| 6,835,072 B1 * | 12/2004 | Simons et al. .............. | 439/66 |
| 6,920,052 B1 * | 7/2005 | Callahan et al. ........... | 361/767 |
| 7,019,979 B1 * | 3/2006 | Wang et al. ................ | 361/719 |

* cited by examiner

*Primary Examiner*—Boris Chervinsky
(74) *Attorney, Agent, or Firm*—Patterson & Sheridan, L.L.P.

(57) ABSTRACT

The present invention represents a significant advancement in the field of thermal solutions for computer hardware. In one embodiment, a quick-connect system for cooling a heat-generating electronic device is provided. The electronic device is mounted to a first side of a circuit board. The system includes a first plate having an opening and configured to be coupled to the first side of the circuit board. The system further includes a second plate disposed within the opening and coupled to the first plate with a first suspension system, wherein the first suspension system is configured to enable the second plate to be disposed substantially flat against the electronic device when the first plate is coupled to the first side of the circuit board. The system further includes a cooling module thermally coupled to the second plate and configured to dissipate heat transferred from the electronic device to the second plate.

20 Claims, 8 Drawing Sheets

QUICK-CONNECT THERMAL SOLUTION FOR COMPUTER HARDWARE TESTING

BACKGROUND OF THE INVENTION

1. Field of the Invention

This invention relates generally to computer hardware and more particularly to a quick-connect thermal solution for testing computer hardware.

2. Description of the Related Art

FIG. 1 is an isometric view illustrating a prior art thermal solution assembly 100 used, for example, to cool heat-generating electronic devices in a computer system, such as a graphics processor. As shown, thermal solution assembly 100 characteristically includes a fan 106, fins 109 and a bottom plate 111. Typically, thermal solution 100 is thermally coupled to the graphics processor, for example using thermal adhesive or grease having thermal properties that facilitate transferring heat generated by the electronic device to the bottom plate 111. Thermal solution assembly 100 may also include a heat sink lid (not shown), which, among other things, prevents particles and other contaminants from entering fan 106 and air blown from fan 106 from escaping thermal solution 100. The heat sink lid, together with the fins 109 and the bottom plate 111, define a plurality of air channels 108.

Fan 106 is configured to force air through air channels 108 over bottom plate 111 such that the heat generated by the graphics processor transfers to the air. The heated air then exits heat sink assembly 104, as depicted by flow lines 114, thereby dissipating the heat generated by the electronic device into the external environment. This process cools the graphics processor, preventing the device from overheating during operation. Persons skilled in the art will understand that air channels 108 typically are configured to direct air blown from fan 106 over bottom plate 111 and into the external environment in a manner that most efficiently removes heat from the graphics processor.

FIG. 2 is a plan view of a prior art graphics card 200. As shown, graphics card 200 includes, without limitation, a circuit board 201, a processing unit, such as a graphics processing unit (GPU) 205, and eight memory units 210a–h. As described herein, during operation, the GPU 205 and memory units 210a–h generate heat energy that must be removed by a thermal solution, such as thermal solution 100, to prevent these electronic devices from overheating and failing. Therefore, disposed through the graphics card 200 are various sets of smooth bores 215, 220, 225 that correspond with various pieces of mounting equipment for the thermal solution 100.

As thermal solution assemblies have become more complex, the labor cost involved in installing and removing thermal solutions has become significant. For example, some prior art thermal solutions include one heat sink for the GPU and a separate heat sink for the memory units, thus requiring upwards of 12 screws to be tightened/loosened to attach/detach the thermal solution to/from the graphics card. To reduce costs, manufacturers typically attach their own thermal solutions to graphics cards, perform quality control tests on the graphics cards, and then ship the graphics cards with the attached thermal solutions to their customers. A significant drawback of this approach is that customers oftentimes want to use their own thermal solutions with the graphics cards, not the manufacturers' thermal solutions. First, a customer's thermal solution may be less expensive than a manufacturer's thermal solution. Second, a customer's thermal solution may perform better than a manufacturer's thermal solution. Third, a customer may want to install its own thermal solution in order to control the aesthetics of the graphics card. Under the current approach, however, if a customer wants to use its own thermal solution, then that customer must incur the additional costs associated with removing the manufacturer's thermal solution from the graphics card and installing its own thermal solution.

Therefore, there exists a need in the art for a thermal solution that does not require significant labor to attach to and detach from a graphics card such that the thermal solution may be installed on a graphics card for testing and then removed from the graphics card before shipping.

SUMMARY OF THE INVENTION

In one embodiment, a quick-connect system for cooling a heat-generating electronic device is provided. The electronic device is mounted to a first side of a circuit board. The system includes a first plate having an opening and configured to be coupled to the first side of the circuit board. The system further includes a second plate disposed within the opening and coupled to the first plate with a first suspension system, wherein the first suspension system is configured to enable the second plate to be disposed substantially flat against the electronic device when the first plate is coupled to the first side of the circuit board. The system further includes a cooling module thermally coupled to the second plate and configured to dissipate heat transferred from the electronic device to the second plate.

One advantage of the disclosed quick-connect system is that it can be connected to a graphics card in a few simple steps. Among other things, this capability enables the cooling module to be thermally coupled to the GPU temporarily during performance testing. Once testing is completed, the quick-connect system can be quickly and easily removed from the graphics card, thereby allowing the graphics card to be shipped to the customer without an attached thermal solution.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a side section view of the quick-connect thermal solution taken along lines 3A—3A in FIGS. 3B and 3D. FIG. 3B is a first perspective plan view of a cooling module subassembly of the quick-connect thermal solution. FIG. 3C is a second perspective plan view of the cooling module subassembly. FIG. 3D is a plan view of a bottom plate subassembly of the quick-connect thermal solution.

DETAILED DESCRIPTION OF PREFERRED EMBODIMENT(S)

FIGS. 3A–D are various views of a quick-connect thermal solution 300, according to one embodiment of the present invention. As shown the quick-connect thermal solution 300 is configured to be thermally and structurally coupled to a graphics card, such as the graphics card 200 illustrated in FIG. 2. In alternate embodiments, the quick-connect thermal solution 300 may be configured to be coupled to any type of circuit board for cooling a heat-generating electronic device mounted on that circuit board.

For ease of illustration, the graphics card 200 is not illustrated these figures. If shown in FIG. 3A, for example, the graphics card 200 would be located between the outer plate 323 and a bottom plate 324, the top side of the graphics card 200 including the GPU 205 and the memory units 210a–h being disposed adjacent to outer plate 323. All references to directions, such as "top" and "bottom", are for reference purposes only and in no way limit the scope of the present invention. The quick-connect thermal solution 300 may be configured so that it will mount on graphics cards with designs different than that of graphics card 200 of FIG. 2. Modifications of the quick-connect thermal solution 300 in this manner are within the knowledge of one of ordinary skill in the art. In particular, graphics cards may be designed to fit specific customer requirements or conform to standards promulgated by the trade.

Figure 3A:
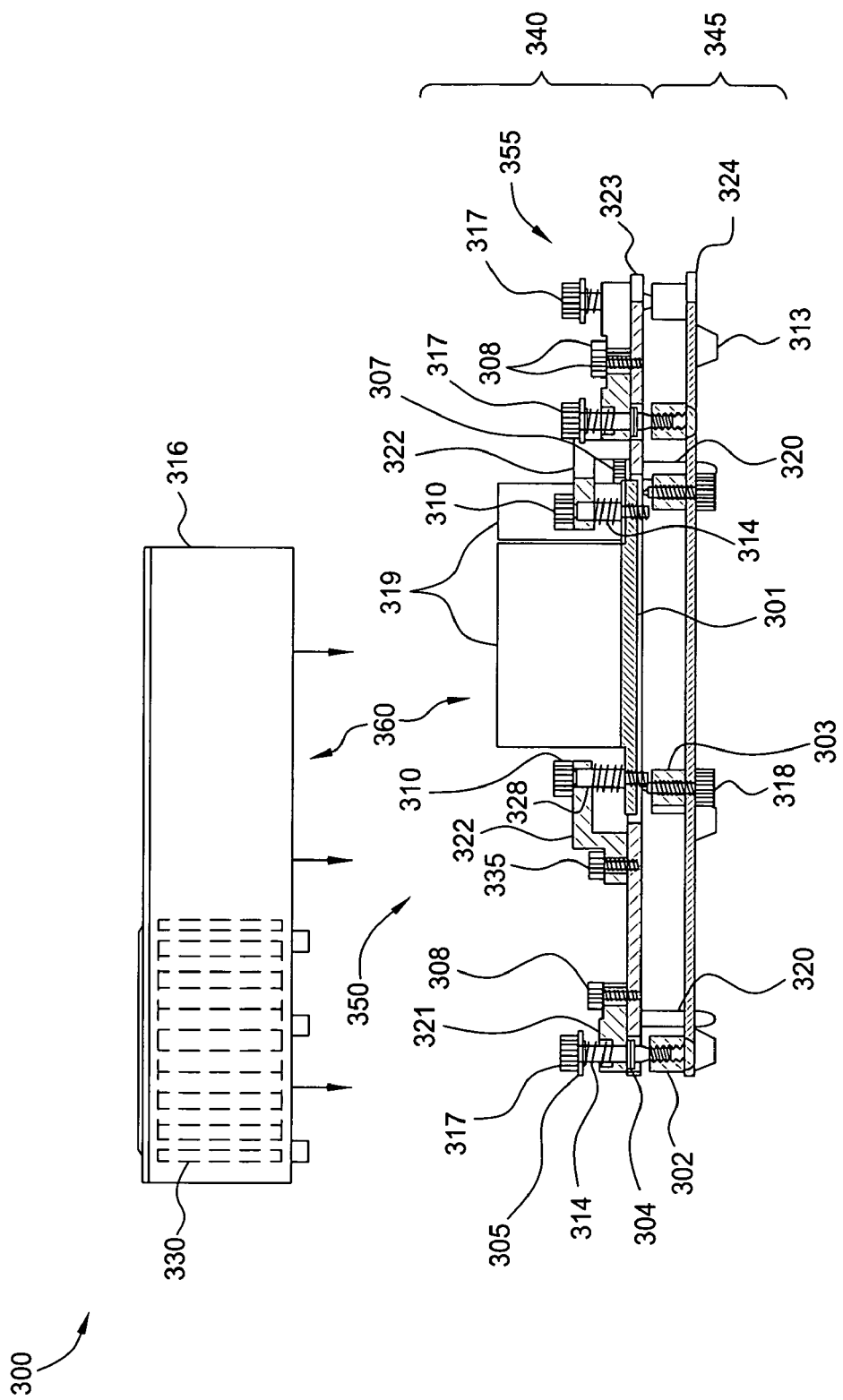
FIGS. 3A–D are various views of a quick-connect thermal solution, according to one embodiment of the present invention.
Figure 3B:
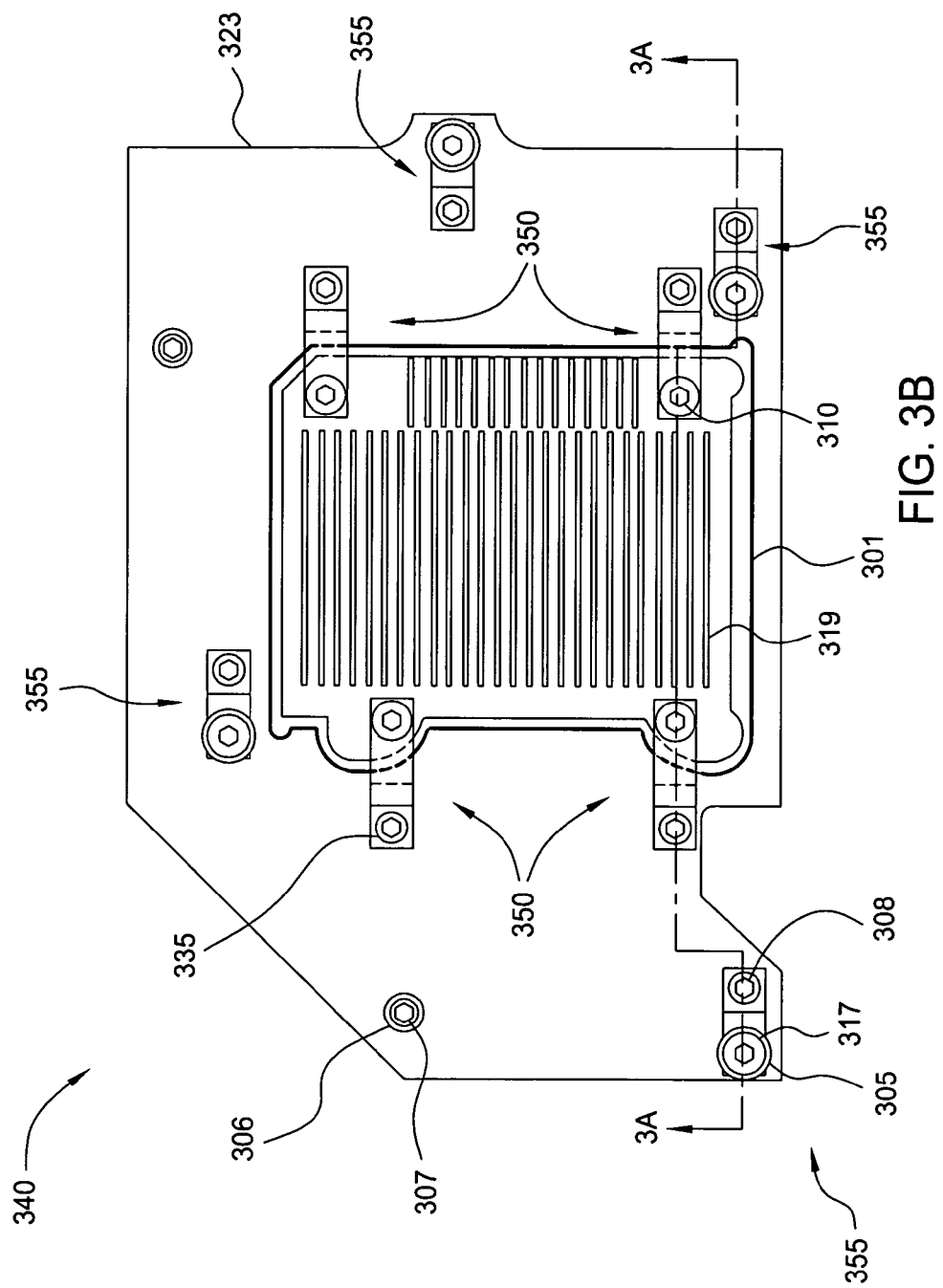
Figure 3C:
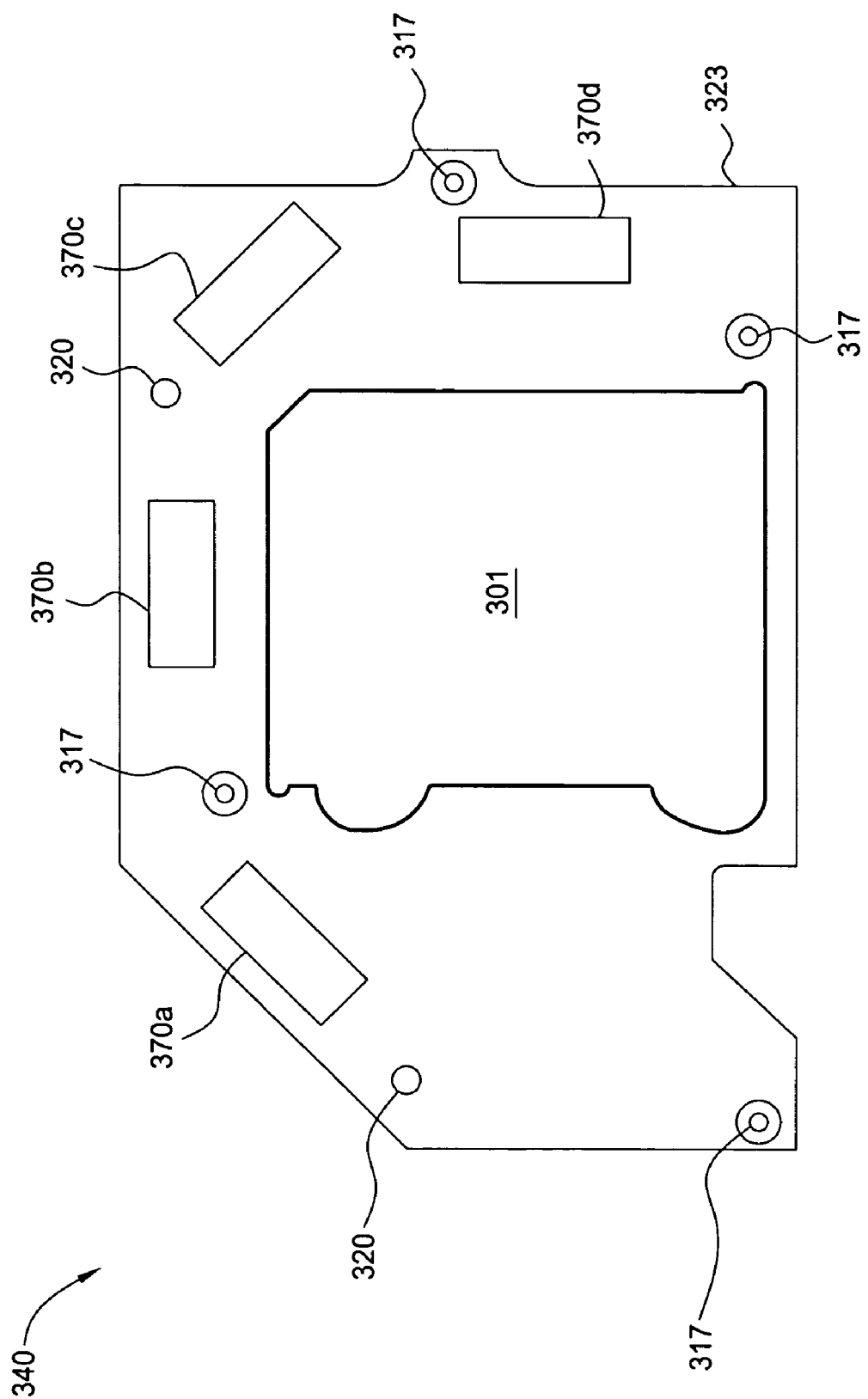
Figure 3D:
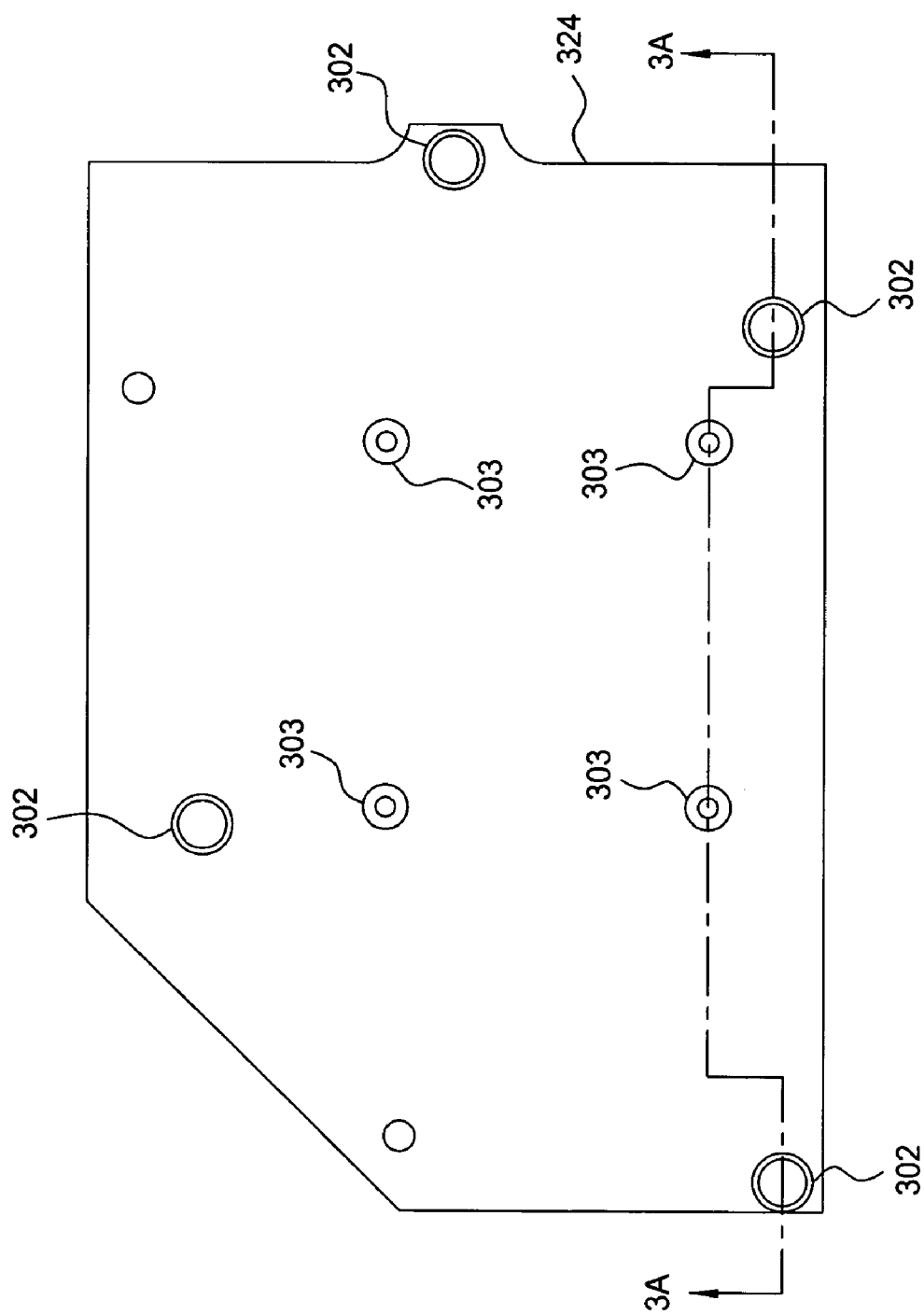

FIG. 3A is a side section view of the quick-connect thermal solution 300, taken along line 3A—3A in FIGS. 3B and 3D, according to one embodiment of the present invention. The quick-connect thermal solution 300 includes, without limitation, a cooling module subassembly 340 and a bottom plate subassembly 345.

FIG. 3B is a first perspective plan view of the cooling module subassembly 340 of the quick-connect thermal solution 300. Referring also to FIG. 3A, the cooling module subassembly 340 includes an outer plate 323, an inner plate 301, an outer suspension system 355, an inner suspension system 350, and a cooling module 360. The outer plate 323 and the inner plate 301 are made from a thermally conductive material, such as aluminum. The inner plate 301 is coupled to the outer plate 323 by the inner suspension system 350.

As shown, the inner suspension system 350 includes four Z-blocks 322, four springs 314, a first set of four cap screws 335, a second set of four cap screws 310, and four sleeves 328. The Z-blocks 322 are each coupled to the outer plate 323 by one of the first cap screws 335. Each first cap screw 335 is received in a respective threaded bore through the outer plate 323 and in a smooth bore through a respective Z-block 322. Caps of the first cap screws 335 are sized larger in diameter than the bores through the Z-blocks 322, thereby retaining the Z-blocks between the cap screws and the outer plate 323. Each second cap screw 310 is received in a respective threaded bore through the inner plate 301, in a smooth bore through a respective Z-block 322, and a respective smooth bore (not shown) through the sleeve 328. Each sleeve 318 shoulders against the inner plate 301 and is received in the respective bore through the Z-block 322. Caps of the second cap screws 310 are sized larger in diameter than the bores through the Z-blocks 322, thereby coupling the inner plate 301 to the outer plate 323. Disposed along each sleeve 328 is a respective one of the springs 314. The lengths of the sleeves 328 and cap screws 310 are sized so compression of the springs 314 disposed along the sleeves 328 may be adjusted. The springs 314 each abut the inner plate 301 on one end and a respective Z-block 322 on the other end.

As shown, the outer suspension system 355 includes four blocks 321, four cap screws 308, four springs 314, four shoulder screws 317, and four retaining members 304. The blocks 321 are each coupled to the outer plate 323 by one of the cap screws 308. Each first cap screw 308 is received in a respective threaded bore through the outer plate 323 and in a smooth bore through a respective block 321. Caps of the cap screws 308 are sized larger in diameter than the bores through the blocks 321, thereby retaining the blocks between the cap screws and the outer plate 323. Each shoulder screw 317 is received in a smooth bore through a respective block 321 and the outer plate 323.

A retaining member 304, such as a snap ring, retaining ring, or split ring, is disposed in a groove (not shown) of each shoulder screw 317 and in the smooth bore of the outer plate 323. The retaining members 304 are larger in diameter than the bores through the blocks 321 for the shoulder screws 317, thereby coupling each shoulder screw to the respective block 321. Disposed along each shoulder screw 317 and partially within a recess of each bracket 321 is a respective one of the springs 314. The springs 314 each abut a washer 305, which abuts a cap of each shoulder screw 317, on one end and a respective shoulder formed by an end of each recess within each bracket 321 on the other end. A portion of an outer surface of each shoulder screw 317 between the retaining member 304 and a threaded end may be tapered to ensure a snug fit with a respective smooth bore in the graphics card 200.

Figure 1:
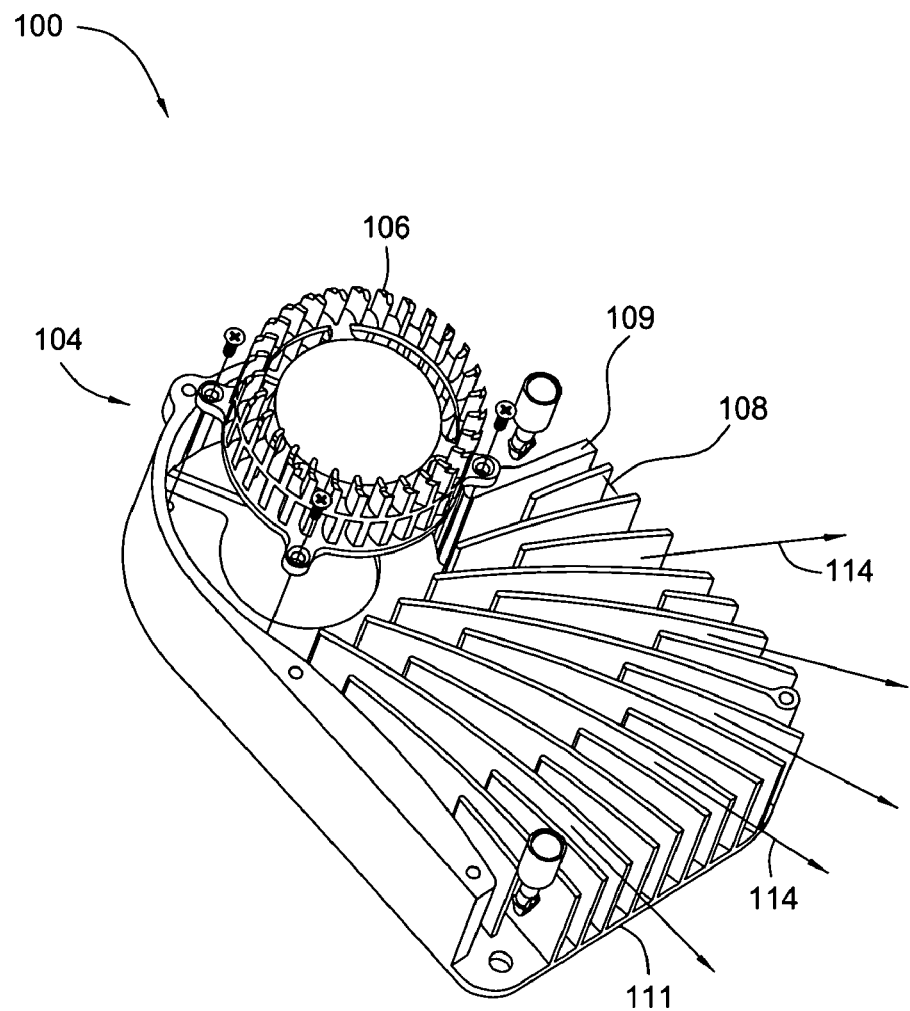
FIG. 1 is an isometric view illustrating a prior art system used to cool a processor.

Referring back to FIG. 3A, thermally coupled to the inner plate 301 is the cooling module 360. As shown, the cooling module 360 comprises a fan 330 (shown by dashed lines), enclosed in a housing 316, and a plurality of fins 319 thermally coupled to the inner plate 301, similar to the thermal solution 100 of FIG. 1. The fins 319 are made from a thermally conductive material, such as aluminum or copper. The housing 316 should be configured so that it does not obstruct access to the shoulder screws 317. The housing 316 may be configured to enclose a substantial portion of the top side of the outer plate 323, thereby thermally coupling the cooling module 360 to both the outer plate 323 and the inner plate 301.

In alternative embodiments, the housing 316 may be configured so that the cooling module is only thermally coupled to the inner plate 301 since the GPU 205 generates substantially more heat than the memory units 210a–h. The cooling module 360 could be integrated with the outer plate 323 and/or inner plate 301 or may be a structurally separate element that is thermally coupled to the outer plate 323 and/or inner plate 301. In alternative embodiments, the cooling module 360 does not necessarily have to be a fan sink system. The cooling module 350 may be any other type of cooling module, such as, for example, a liquid circulation system or an air/liquid hybrid cooling module.

FIG. 3C is a second perspective plan view of the cooling module subassembly 340. Referring also to FIG. 3A, disposed on the outer plate 323 are two alignment pins 320. The alignment pins 320 are secured to the outer plate 323 by cap screws 307 and washers 306. The alignment pins 320 are received through smooth bores disposed through the bottom plate 324. In one embodiment, thin layers 370a–d of a conductive material are bonded to the bottom side of the outer plate 323. The thin layers 370a–d correspond to the memory units 210a–h (for example, each of the thin layers 370a–d may cover two memory units) and facilitate forming a heat conductive interface between the memory units 210a–h and the outer plate 323. In alternative embodiments, thermal grease may be applied to the tops of the memory units 210a–h to create the heat conductive interface, or the outer plate 323 may simply be allowed to rest directly on the memory units 210a–h since heat can transfer from memory units 210a–h directly to the outer plate 323. Further, if the graphics card 200 has memory units on both sides, corresponding thin layers of conductive material may be disposed on the facing side of the bottom plate 324 in similar fashion.

FIG. 3D is a plan view of the bottom plate subassembly 345 of the quick-connect thermal solution 300. Referring also to FIG. 3A, the bottom plate subassembly 345 includes the bottom plate 324 and other assorted hardware. The bottom plate 324 may also be made from a thermally conductive material, such as aluminum. Press fit into the bottom plate 324 are four sockets 302. Disposed through each socket 302 is a threaded bore. Each threaded bore receives the threaded end of a respective shoulder screw 317, thereby coupling the cooling module subassembly 340 to the bottom plate subassembly 345. The lengths of the sockets 302 and the lengths of the threaded ends of the shoulder screws 317 are sized so compression of the springs 314 disposed along the shoulder screws may be adjusted. Disposed on a bottom side of the bottom plate 324 are four feet 313. The feet are secured to the bottom plate 324 in any manner known in the art.

Disposed on the bottom plate 324 are four standoffs 303. The standoffs 303 are formed from an insulating material, such as nylon. The standoffs are each coupled to the bottom plate 324 by a cap screw 318. Each cap screw 318 is sized so that its shaft extends past through each standoff 303 and is thereby exposed. The exposed portion of each cap screw 318 serves as an alignment pin that is received by a corresponding alignment hole in the graphics card 200. The standoffs 303 and the sockets 302 provide support for the graphics card 200 when the quick-connect thermal solution 300 is assembled around the graphics card. The standoffs 303 may be configured as necessary to balance the loading applied by the two suspension systems to thereby prevent substantial deformation of the graphics card due to the forces applied by the suspension systems. Preferably, at least four standoffs 303 are provided. Excessive deformation of the graphics card 200 may also adversely affect reliability. Alternatively, the bottom plate subassembly 345 may be omitted. In this alternate embodiment, the shoulder screws 317 would be received by threaded bores in the graphics card 200.

Alternatively, the outer plate 323 and bottom plate 324 may be connected together outside of the perimeter of the graphics card 200. In this alternative embodiment, the graphics card 200 would be coupled to the outer plate 323 and bottom plate 324 by friction.

The outer plate 323 and the inner plate 301 transfer heat energy, via conduction, from the memory units 210a–h and the GPU 205, respectively. In order to maintain the necessary thermal coupling, it is important the outer plate 323 be disposed substantially flat against the memory units 210a–h and the inner plate 301 be disposed substantially flat against the GPU 205. If firm contact between the respective parts is not maintained, gaps of air may form between them. If formed, the gaps of air would insulate the various parts from one another, thereby impeding the flow of heat energy by conduction. These gaps may be formed by differences in coplanarity among the memory units 210a–h and the GPU 205. The differences in coplanarity may arise from various sources, such as tolerances or differing amounts of thermal expansion among the memory units 210a–h and the GPU 205.

The two suspension systems ensure that adequate contact is maintained between the respective parts by providing eight points of independent suspension to compensate for changes in coplanarity between the GPU 205 and the memory units 210a–h of graphics card 200. The suspension systems allow for the outer plate 323 and the inner plate 301 to "float" over the memory units 210a–h and the GPU 205, respectively. In this manner, the springs 314 of the suspension systems compensate for the changes in coplanarity between the GPU 205 and the memory units 210a–h. Alternatively, more or less points of suspension may be provided.

More specifically, the second cap screws 310 of the inner suspension system 350 and the shoulder screws 317 are preferably tightened in relation to one another so that the force exerted by the outer suspension system 355 on the outer plate 323 is greater than that exerted by the inner suspension system 350 on the inner plate 301. Otherwise, if the screws 310, 317 were tightened such that the force between the inner suspension system 350 and the inner plate 301 were greater, then substantial contact between the outer plate 323 and the memory units 210a–h necessary for heat conduction would not be able to be properly maintained. This is due to the fact that as the second cap screws 310 of the inner suspension system 350 are tightened, increasing the spring force exerted on the inner plate 301, the inner suspension system 350 exerts an equal and opposite force on the outer plate 323. This equal and opposite force prevents the outer plate 323 form being "pushed" against the memory units 210a–h on the graphics card 200 when screws 317 of the outer suspension system 355 are tightened.

In another embodiment, the force exerted by the outer suspension system 355 should be equal to or greater than one and one-half times the force exerted by the inner suspension system 350. In yet another embodiment, the force exerted by the second suspension should be equal to or greater than twice the force exerted by the inner suspension system 350. In one embodiment, a torque of about 1 to about 1.5 in-lb applied to the shoulder screws 317 during mounting of the quick-connect thermal solution 300 to the graphics card 200 has proven satisfactory.

Using suspension systems to apply forces on the inner plate 301 and the outer plate 323 allows for good control over the direct forces exerted on the graphics card 200. These suspension systems are advantageous over directly mounting the plates 323, 301 onto a graphics card because, in typical torque ranges for mounting thermal solutions, translation of screw torque to direct force while maintaining functional tolerance and doing so repeatedly is difficult with even the best torque drivers.

Before assembling the quick-connect thermal solution 300 with the graphics card 200, the cooling module subassembly 340 is first pre-assembled. In pre-assembly of the cooling module subassembly 340, the inner suspension system 350 is assembled and set, connecting the inner plate 301 to the outer plate 323, the outer suspension system 355 is assembled, and the cooling module 360 is attached to at least the inner plate 301. After pre-assembly, the only screws that need to be tightened or loosened for assembly of the quick-connect thermal solution 300 with the graphics card 200 are the shoulder screws 317 of the outer suspension system 355.

Figure 2:
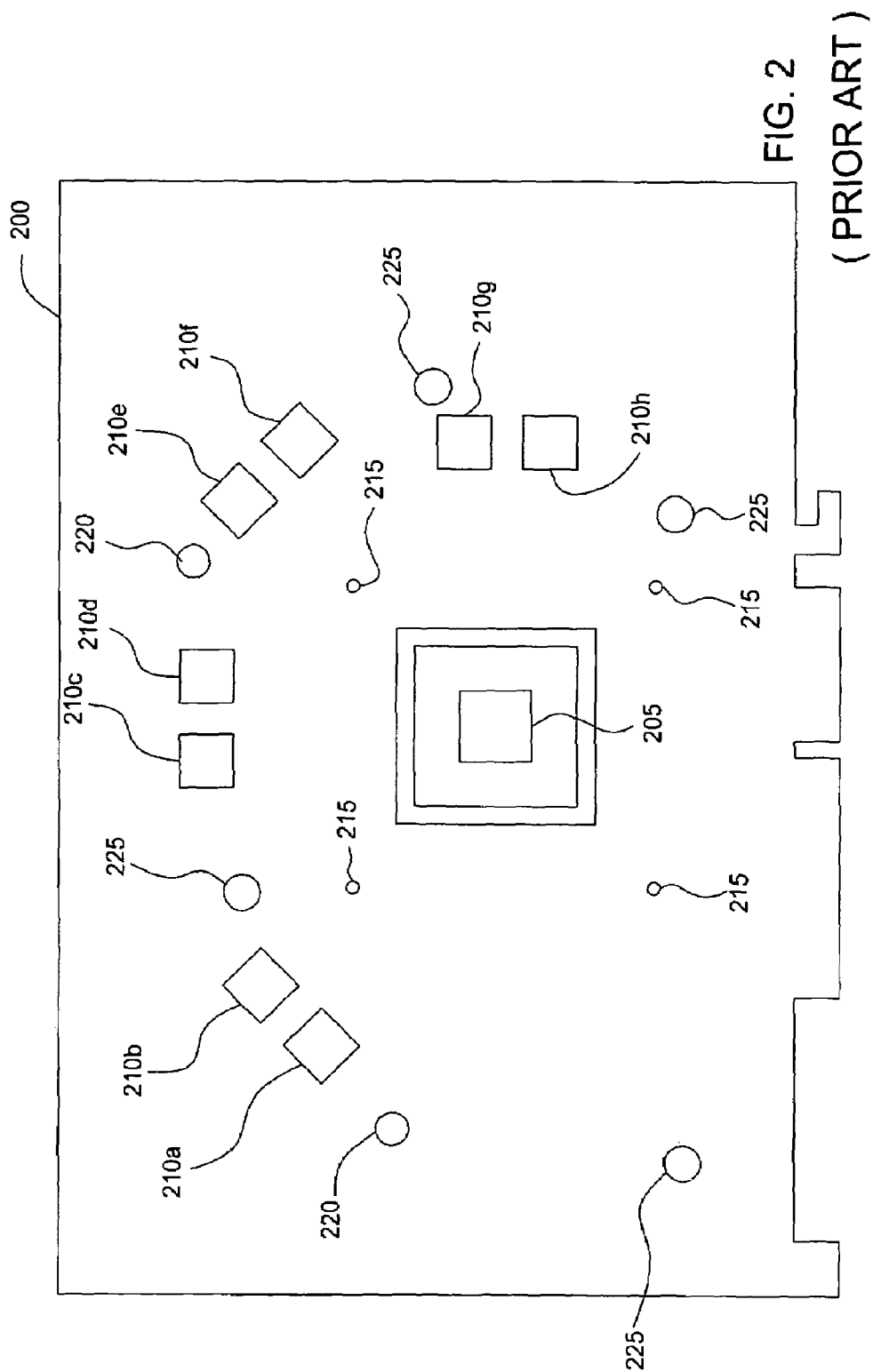
FIG. 2 is a plan view of a prior art graphics card.
Figure 4:
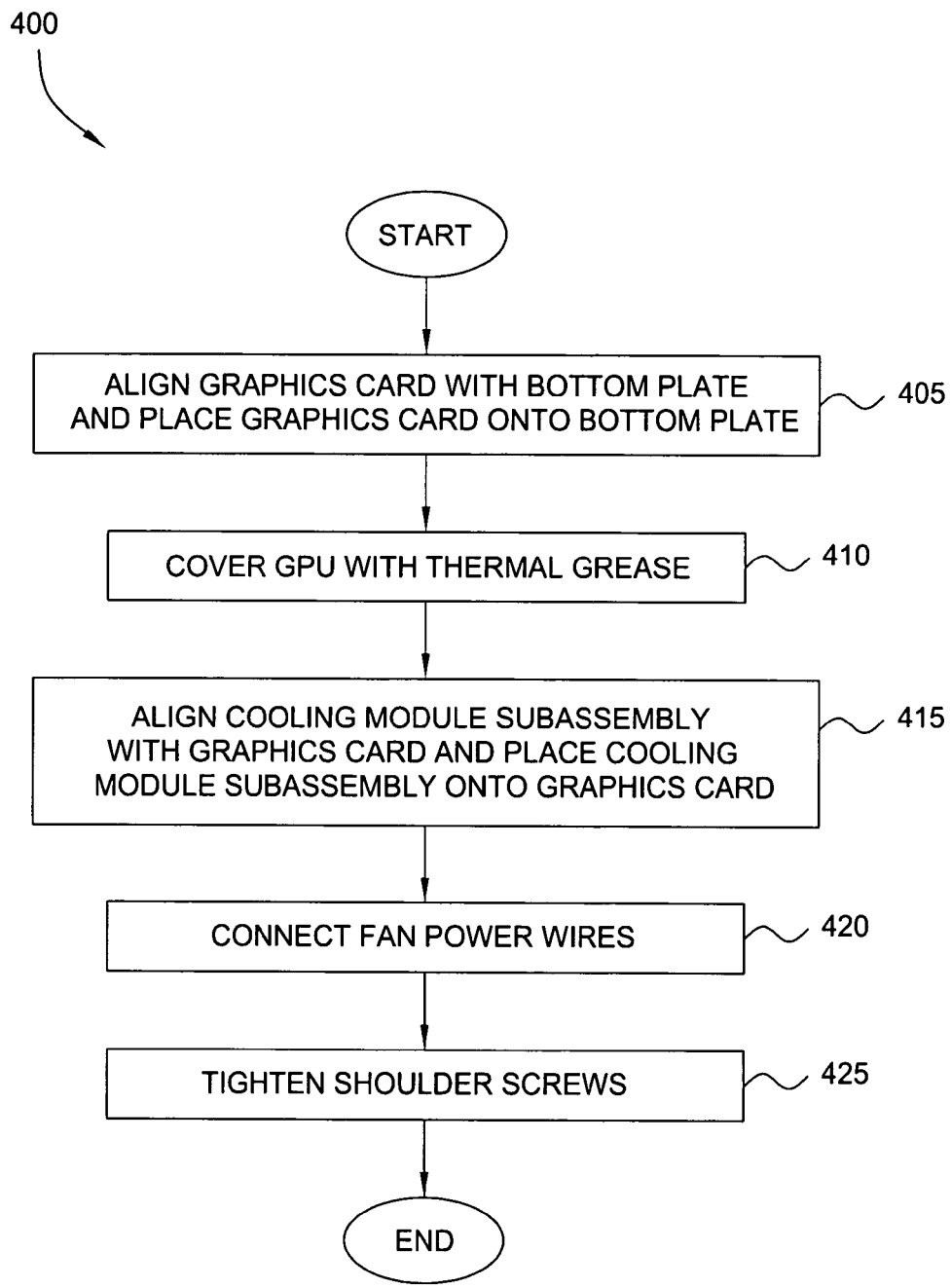
FIG. 4 is a flow chart illustrating a method of assembling the quick-connect thermal solution with a graphics card, according to one embodiment of the present invention.

FIG. 4 is a flow chart illustrating a method 400 of assembling the quick-connect thermal solution 300 with a graphics card, such as the graphics card 200 of FIG. 2, according to one embodiment of the present invention. Assuming that the cooling module subassembly 340 has been pre-assembled, the method begins at step 405, where the graphics card 200 is first placed over the bottom plate 324 so that alignment pins 318 (the portion of the cap screws extending out from the standoffs 303) are received in bores 215. As previously explained, the graphics card 200 will rest on the standoffs 303. At step 410, the GPU 205 is covered with thermal grease.

At step 415, the outer plate 323 is placed over the graphics card 200 so that alignment pins 320 are received through bores 420 (and corresponding bores in the bottom plate 324). During this step 415, the inner plate 301 engages the GPU 205 and the shoulder screws 317 are received through bores 225 disposed through the graphics card 200. Heat sinks 340a–d are directly over memory units 210a–h, respectively, however, there may be a small gap between the heat sinks and the memory units due to the inner suspension system 350 exerting an upward force on the outer plate 323 and/or a lack of coplanarity between the GPU 205 and the memory units 210a–h. At step 420, fan power wires (not shown) may be connected to a power supply disposed on the graphics card 200 (not shown) after this step. At step 425, the shoulder screws 317 are tightened into the sockets 302 to bring the heat sinks 340a–d into firm contact with the memory units 210a–h. Assembly of the quick-connect thermal solution 300 onto the graphics card 200 is now complete. The graphics card 200, with temporarily attached cooling module 360, may then be connected to a motherboard for testing.

Figure 5:
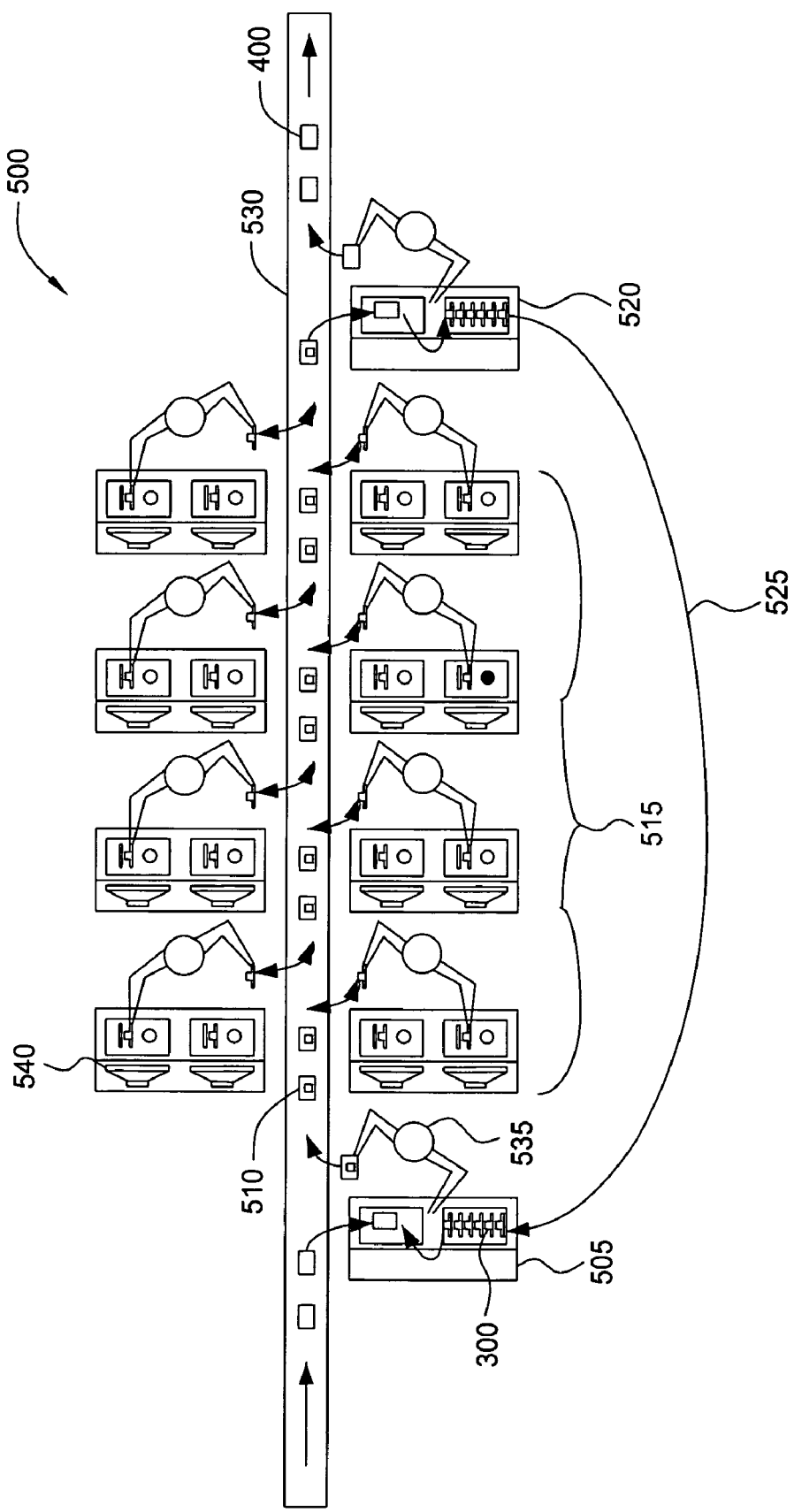
FIG. 5 illustrates a method for using the quick-connect thermal solution for performance testing of graphics cards on an assembly line, according to one embodiment of the present invention.

FIG. 5 illustrates a method for using the quick-connect thermal solution 300 for performance testing of graphics cards on an assembly line 500, according to one embodiment of the present invention. A plurality of graphics cards 200 are running along a conveyor 530. At a loading station 505, an operator 535 removes a graphics card 200 from the conveyor 530 and assembles the quick-connect thermal solution 300 with the graphics card 200, as set forth above in conjunction with the method of FIG. 4, to form a test unit 510. The operator 535 returns the test unit 510 onto the conveyor 530 where it is transported to a testing station 515.

An operator 535 at the testing station 515 removes the test unit 510, connects it to a motherboard of a test computer 540, connects various temperature monitoring devices, and executes a graphics-intensive program on the test computer to performance test the graphics card 200. During this testing process, the cooling module 360 dissipates heat from the GPU 205, as previously discussed herein. Once testing is completed, the operator 535 then indicates whether the particular graphics card 200 has passed or failed inspection. The test unit 510 is then returned to the conveyor 530 where it is conveyed to a removal station 520. At removal station 520, an operator 535 removes the quick-connect thermal solution 300 from the graphics card 200 and returns the graphics card 200 to the conveyor 530. At step 525, the operator 535 at the removal station 520 routes the quick-connect thermal solution 300 back to the loading station 505 for to be reused in another performance test.

One advantage of the disclosed quick-connect system is that it can be connected to a graphics card in a few simple steps. Among other things, this capability enables the cooling module to be thermally coupled to the GPU temporarily during performance testing. Once testing is completed, the quick-connect system can be quickly and easily removed from the graphics card, thereby allowing the graphics card to be shipped to the customer without an attached thermal solution.

While the foregoing is directed to embodiments of the present invention, other and further embodiments of the invention may be devised without departing from the basic scope thereof, and the scope thereof is determined by the claims that follow.

The invention claimed is:

1. A quick-connect system for cooling a heat-generating electronic device mounted to a first side of a circuit board, the system comprising:
   a first plate having an opening and configured to be coupled to the first side of the circuit board;
   a second plate disposed within the opening and coupled to the first plate with a first suspension system, wherein the first suspension system is configured to enable the second plate to be disposed substantially flat against the electronic device when the first plate is coupled to the first side of the circuit board; and
   a cooling module thermally coupled to the second plate and configured to dissipate heat transferred from the electronic device to the second plate.

2. The quick-connect system of claim 1, wherein the second plate is configured to transfer heat energy from the electronic device to the cooling module.

3. The quick-connect system of claim 1, further comprising a third plate configured to be coupled to a second side of the circuit board.

4. The quick-connect system of claim 3, further comprising a second suspension system configured to enable the first plate to be disposed substantially flat against a second heat-generating electronic device mounted to the first side of the circuit board when the first plate is coupled to the first side of the circuit board.

5. The quick-connect system of claim 4, wherein the first plate is configured to transfer heat energy from the second electronic device to the cooling module.

6. The quick-connect system of claim 4, wherein the second suspension system comprises:
   a block configured to be mounted to the first plate;
   a connector configured to be mounted to the third plate and to be disposed through a hole in the block and a hole in the first plate and having a head larger than the hole in the block;
   a spring configured to be disposed along the connector between the connector head and the block; and
   a retaining member coupled to the connector and larger than the hole in the block and smaller than the hole in the first plate.

7. The quick-connect system of claim 4, wherein the first suspension system is configured to exert a first force on the second plate, and the second suspension system is configured to exert a second force on the first plate, when the first plate and the third plate are coupled to the circuit board, the second force being greater than the first force.

8. The quick-connect system of claim 7, wherein the second force is approximately twice the first force.

9. The quick-connect system of claim 1, further comprising a plurality of alignment pins coupled to the first plate for aligning the first plate with the circuit board.

10. The quick-connect system of claim 1, wherein the third plate provides a plurality of supports for the circuit board.

11. The quick-connect system of claim 1, further comprising a plurality of alignment pins coupled to the third plate for aligning the third plate with the circuit board.

12. The quick-connect system of claim 1, wherein the electronics device is a graphics processing unit.

13. The quick-connect system of claim 1, wherein the cooling module is a fan-sink.

14. The quick-connect system of claim 1, wherein the first suspension system comprises:
 a block configured to be mounted to the first plate;
 a sleeve configured to be disposed through a hole in the block and to be shouldered against the first plate and having a hole therethrough;
 a connector configured to be coupled to the second plate and to be disposed through the hole in the sleeve and having a head larger than the hole in the block; and
 a spring configured to be disposed along the connector between the block and the second plate.

15. A method of assembling a quick-connect system for cooling a heat-generating electronic device mounted to a first side of a circuit board, the method comprising:
 disposing the circuit board onto a first plate such that a second side of the circuit board faces the first plate;
 disposing a cooling module subassembly onto the circuit board such that the cooling module subassembly faces the first side of the circuit board, the cooling module subassembly including:
  a second plate having an opening,
  a third plate disposed within the opening and coupled to the second plate with a first suspension system, and
  a cooling module thermally coupled to the third plate and configured to dissipate heat transferred from the electronic device to the third plate; and
 coupling the cooling module subassembly to the first plate such that the third plate is disposed substantially flat against the electronic device.

16. The method of claim 15, wherein the step of disposing the circuit board onto the first plate comprises aligning the circuit board with a plurality of alignment pins disposed on the first plate, and the step of disposing the cooling module subassembly onto the circuit board comprises aligning a plurality of alignment pins disposed on the second plate with the circuit board.

17. The method of claim 15, wherein the first suspension system includes a plurality of blocks mounted to the first plate, and a plurality of connectors, each connector disposed through a hole in a respective block and a respective hole in the first plate.

18. The method of claim 15, wherein a memory unit is disposed on the first side of the circuit board such that when the cooling module subassembly is coupled to the circuit board, the third plate is disposed substantially flat against the memory unit.

19. A method of testing a processing unit disposed on a first side of a circuit board, the method comprising:
 assembling a quick-connect system with the circuit board, including the steps of:
  disposing a second side of the circuit board onto a support plate,
  disposing a cooling module subassembly onto the first side of the circuit board, and
  coupling the cooling module subassembly to the support plate such that an inner plate of the cooling module subassembly is disposed substantially flat against the processing unit;
 performance testing the processing unit, wherein a cooling module coupled to the inner plate dissipates heat generated by the processing unit during testing; and
 removing the quick-connect system, including the cooling module coupled to the cooling module subassembly, from the circuit board for re-use.

20. The method of claim 19, wherein a memory unit is disposed on the first side of the circuit board such that when the cooling module subassembly is coupled to the support plate, an outer plate of the cooling module subassembly is disposed substantially flat against the memory unit.

* * * * *